(12) United States Patent
Beer

(10) Patent No.: US 7,821,856 B2
(45) Date of Patent: Oct. 26, 2010

(54) MEMORY DEVICE HAVING AN EVALUATION CIRCUIT

(75) Inventor: Peter Beer, Weilheim (DE)

(73) Assignee: Qimoda AG, Munich (DE)

( * ) Notice: Subject to any disclaimer, the term of this patent is extended or adjusted under 35 U.S.C. 154(b) by 91 days.

(21) Appl. No.: 12/201,192

(22) Filed: Aug. 29, 2008

(65) Prior Publication Data

US 2009/0067274 A1   Mar. 12, 2009

(30) Foreign Application Priority Data

Sep. 8, 2007   (DE) ............... 10 2007 042 879

(51) Int. Cl.
*G11C 7/00* (2006.01)
*H03F 3/45* (2006.01)

(52) U.S. Cl. .................. 365/205; 365/208; 327/51; 327/57

(58) Field of Classification Search ............. 365/205
See application file for complete search history.

(56) References Cited

U.S. PATENT DOCUMENTS

| | | | | |
|---|---|---|---|---|
| 4,069,475 A | * | 1/1978 | Boettcher | 365/205 |
| 4,991,142 A | * | 2/1991 | Wang | 365/208 |
| 5,220,527 A | * | 6/1993 | Ohsawa | 365/149 |
| 5,434,821 A | * | 7/1995 | Watanabe et al. | 365/203 |
| 5,754,488 A | * | 5/1998 | Suh | 365/205 |
| 5,862,089 A | * | 1/1999 | Raad et al. | 365/203 |
| 5,917,748 A | * | 6/1999 | Chi et al. | 365/168 |
| 5,936,898 A | * | 8/1999 | Chi | 365/190 |
| 6,061,278 A | * | 5/2000 | Kato et al. | 365/190 |
| 6,137,739 A | * | 10/2000 | Kim | 365/205 |
| 6,687,175 B1 | * | 2/2004 | Mizuno et al. | 365/203 |
| 7,012,831 B2 | * | 3/2006 | Shigenami et al. | 365/149 |
| 7,263,016 B1 | | 8/2007 | Palumbo et al. | |
| 7,505,302 B2 | * | 3/2009 | Song | 365/149 |
| 2007/0109024 A1 | | 5/2007 | Hung | |

OTHER PUBLICATIONS

Sanghoon Hong, Sejun Kim, Jae-Kyung Wee and Seongsoo Lee, "Low-Voltage DRAM Sensing Scheme With Offset-Cancellation Sense Amplifier", IEEE Journal of Solid-State Circuits, vol. 37, No. 10, Oct. 2002, pp. 1356-1360.

* cited by examiner

*Primary Examiner*—Son L Mai
(74) *Attorney, Agent, or Firm*—Patterson & Sheridan, LLP

(57) ABSTRACT

A memory device comprising a memory cell and an evaluation circuit, the memory cell being coupled with the evaluation circuit via a bit line. The memory device further comprises a reference line coupled with the evaluation circuit, the evaluation circuit being designed for amplifying a difference between electric potentials of the bit line and the reference line. Inputs of the evaluation circuit are directly connected to the bit line. Outputs of the evaluation circuit are coupled to the bit line via a switch.

8 Claims, 4 Drawing Sheets

MEMORY DEVICE HAVING AN EVALUATION CIRCUIT

CROSS-REFERENCE TO RELATED APPLICATIONS

This application claims foreign priority benefits under 35 U.S.C. §119 to co-pending German patent application number DE 10 2007 042 879.2-55, filed 8 Sep. 2007. This related patent application is herein incorporated by reference in its entirety.

FIELD

The present invention generally relates to memory devices, and more specifically to evaluating the electric charge in a memory cell.

BACKGROUND

Dynamic random access memories (DRAMs) consist of a plurality of memory cells respectively comprising a storage capacitor and a selection transistor. These memory cells are addressed via word and bit lines which are configured as columns and rows.

Writing into a memory cell is carried out by means of charging an associated storage capacitor with an electric charge corresponding to the respective binary data unit.

During a read operation, the stored charge is read out and amplified by means of an evaluation circuit coupled to the bit line of the memory cell. Specifically, the electric potential of the bit line is compared to the electric potential of a reference line. Depending on the potential difference, the two electric potentials are amplified to two predetermined potential values, the higher potential of the lines being in general drawn to the potential of the supply voltage and the lower potential being drawn to the ground potential.

SUMMARY

The present invention generally relates to memory devices, and more specifically to evaluating the electric charge in a memory cell.

One embodiment of the invention provides a memory device comprising a memory cell and an evaluation circuit, the memory cell being coupled to the evaluation circuit via a bit line. The memory device further comprises a reference line that may be coupled to the evaluation circuit, the evaluation circuit being designed for amplifying a difference between electric potentials of the bit line and the reference line. Inputs of the evaluation circuit may be directly connected to the bit line. Outputs of the evaluation circuit may be coupled to the bit line via a switch.

Another embodiment of the invention provides a method for reading out data from a memory cell of a memory device. The memory cell may be coupled to an evaluation circuit via a bit line, and a reference line may be coupled to the evaluation circuit. The evaluation circuit amplifies a difference between electric potentials of the bit line and the reference line. The potential difference is first amplified by the evaluation circuit in one part of the bit line and in one part of the reference line. After a predetermined period of time the partial bit line is coupled to the remaining portion of the bit line, the partial reference line is coupled to the remaining portion of the reference line, and the potentials are further amplified.

Yet another embodiment of the invention provides an integrated circuit comprising the memory device described above.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
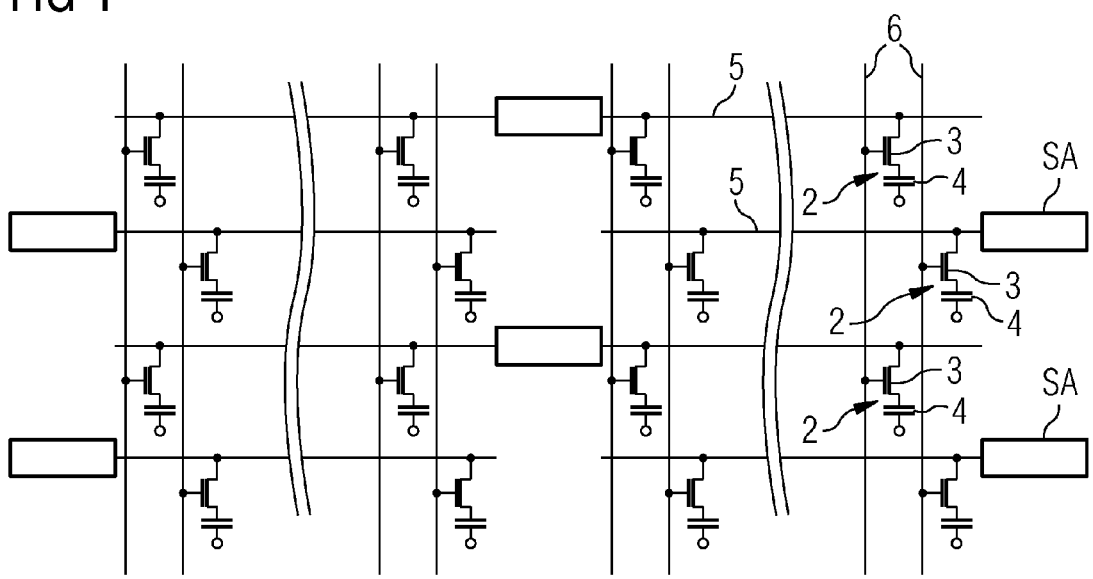
FIG. 1 schematically shows an exemplary array of memory cells, according to an embodiment of the invention.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

FIG. 1 depicts a section of an exemplary DRAM memory having a regular arrangement of memory cells 2 and evaluation circuits SA, according to an embodiment of the invention. Each memory cell 2 may include a selection transistor 3 and a storage capacitor 4, as illustrated in FIG. 1. The storage capacitor 4 may store binary information in the form of electric charge. Each memory cell 2 may be coupled to a bit line 5 and to a word line 6. Each bit line 5 may be coupled to a plurality of memory cells 2. For purposes of simplicity, the bit lines 5 are shown connected to two memory cells 2 in FIG. 1. Word lines 6 which may run perpendicularly to the bit lines 5 may also coupled to a plurality of memory cells 2. Each of the memory cells 2 may be distinctly addressed by a combination of a bit line 5 and a word line 6. For example, by applying a positive voltage to the word line 6 coupled to a gate terminal of a selection transistor 3 of a memory cell, a charge exchange may be initiated between a storage capacitor 4 of a memory cell 2 and the associated bit line 5.

Each evaluation circuit SA may be coupled to two bit lines 5, as illustrated in FIG. 1. In one embodiment, each evaluation circuit SA may amplify a potential difference occurring between the two connected bit lines 5. In a particular embodiment, each evaluation circuit SA may amplify the electric potentials on the two connected bit lines 5 to pre-determined potential values based on their difference. The evaluation circuit SA may be a sense amplifier or a read amplifier.

Figure 2:
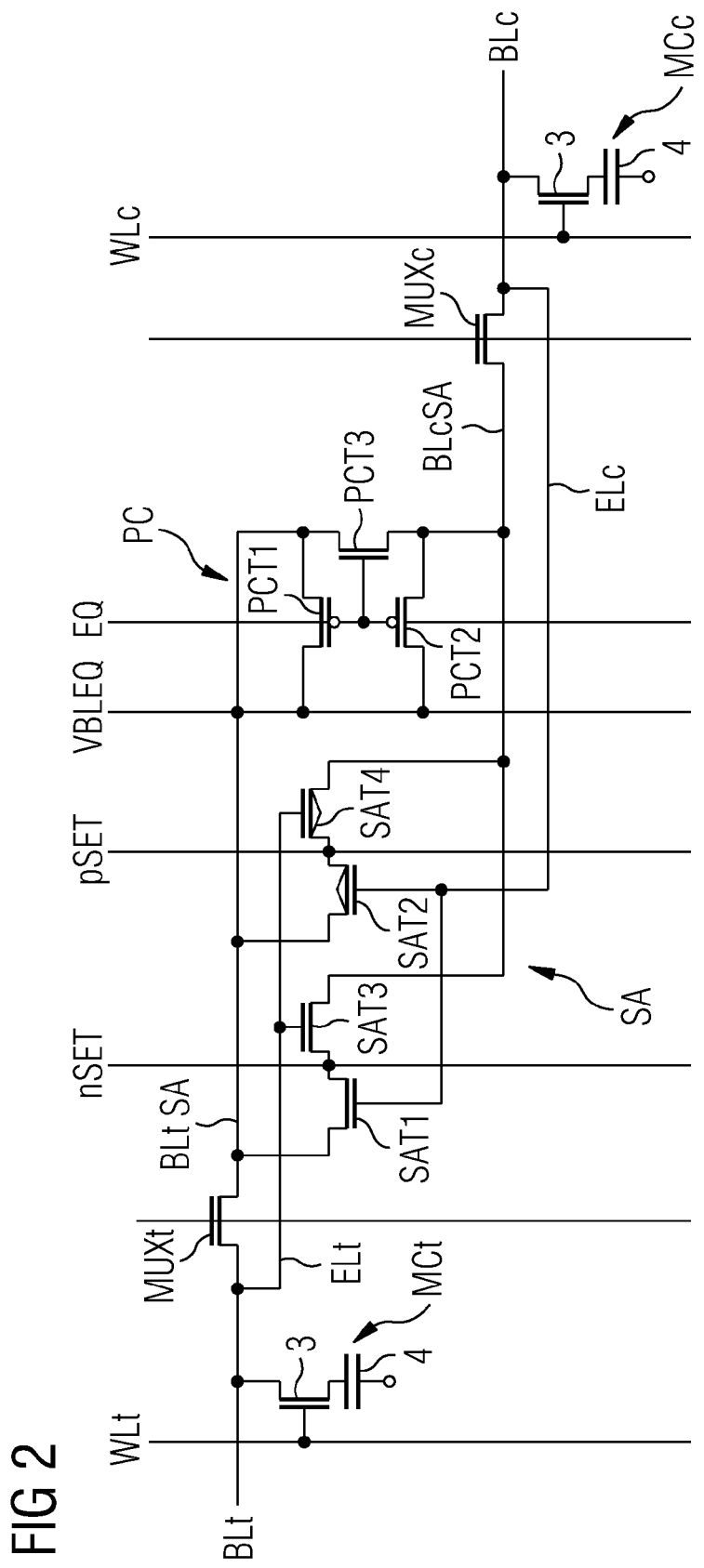
FIG. 2 schematically shows an exemplary section of a memory cell array having two memory cells, a bit line precharge unit as well as an evaluation circuit, according to an embodiment of the invention.

FIG. 2 schematically shows a section of an exemplary DRAM memory, according to an embodiment of the invention. A first memory cell MCt may include a selection transistor 3 and of a storage capacitor 4, as illustrated in FIG. 2. The gate terminal of the selection transistor 3 of the first memory cell MCt may be coupled to a first word line WLt. A drain of the selection transistor 3 of the first memory cell MCt may be coupled to a first outer bit line BLt. A second memory cell MCc also may include a selection transistor 3 and a storage capacitor 4, as illustrated in FIG. 2. The gate terminal of the selection transistor 3 of the second memory cell MCc may be coupled to a second word line WLc. The drain of the selection transistor 3 of the second memory cell MCc may be coupled to a second outer bit line BLc.

Further, as illustrated in FIG. 2, the first outer bit line BLt may be coupled to a first inner bit line BLt SA via a first transistor switch MUXt. The second outer bit line BLc may be coupled to a second inner bit line BLc SA via a second transistor switch MUXc. By applying a positive voltage to the gate contact of the first transistor switch MUXt the potentials of the first outer bit line BLt and of the first inner bit line BLt SA may be balanced by connecting the first outer bit line BLt and the first inner bit line BLt SA to each other. By applying a positive voltage at the gate contact of the second transistor switch MUXc, the potentials of the second outer bit line BLc and of the second inner bit line BLc SA may be balanced by connecting the second outer bit line BLc and the second inner bit line BLc SA.

The first outer bit line BLt, the first inner bit line BLt SA, the second outer bit line BLc and the second inner bit line BLc SA may be pre-charged to a potential VBLEQ by means of a pre-charge unit PC. The pre-charge unit PC may include a first transistor PCT1. A gate contact of the first transistor PCT1 may be coupled to a switch line EQ. A first base contact of the first transistor PCT1 may be coupled to a potential VBLEQ. A second base contact of the first transistor PCT1 may be coupled to the first inner bit line BLt SA.

The pre-charge unit PC may further include a second transistor PCT2. A gate contact of the second transistor PCT2 may be coupled with the switch line EQ. A first base contact of the second transistor PCT2 may be coupled to a potential VBLEQ. A second base contact of the second transistor PCT2 may be coupled to the second inner bit line BLc SA.

The pre-charge unit PC may also include a third transistor PCT3. A gate contact of the third transistor PCT3 may be coupled with the switch line EQ. A first base contact of the third transistor PCT3 may be coupled to the first inner bit line BLt SA. A second base contact of the third transistor PCT3 may be coupled to the second inner bit line BLc SA.

When a positive voltage is applied to the switch line EQ, the pre-charge unit PC may charge the first inner bit line BLt SA and the second inner bit line BLc SA to the potential VBLEQ. If the first transistor switch MUXt is open, the first inner bit line BLt SA may be coupled with the first outer bit line BLt and the first outer bit line BLt may be charged to the potential VBLEQ. If the second transistor switch MUXc is open, the second inner bit line BLc SA may be coupled with the second outer bit line BLc and the second outer bit line BLc may be charged to the potential VBLEQ.

Furthermore, an evaluation circuit SA is depicted in FIG. 2. The evaluation circuit SA may include a first transistor SAT1, as illustrated. A first base contact of the first transistor SAT1 may be coupled with a switch line nSET as well as with a first base contact of a third transistor SAT3. A second base contact of the first transistor SAT1 may be coupled with a second base contact of a second transistor SAT2 as well as with the first inner bit line BLt SA. In one embodiment, the second base contact of the first transistor SAT1 may be directly connected to the first inner bit line BLt SA. A gate contact of the first transistor SAT1 may be coupled with a gate contact of the second transistor SAT2 as well as with a second further signal line ELc, as illustrated in FIG. 2.

The evaluation circuit SA may further include the second transistor SAT2. A first base contact of the second transistor SAT2 may be coupled with a switch line pSET as well as with a first base contact of a fourth transistor SAT4. The second base contact of the second transistor SAT2 may be coupled with the second base contact of the first transistor SAT1 as well as with the first inner bit line BLt SA. In one embodiment, the second base contact of the second transistor SAT2 may be directly connected to the first inner bit line BLt SA. The gate contact of the second transistor SAT2 may be coupled with the gate contact of the first transistor SAT1 as well as with the second further signal line ELc, as illustrated in FIG. 2.

The evaluation circuit SA may also include the third transistor SAT3. The first base contact of the third transistor SAT3 may be coupled with the switch line nSET as well as with the first base contact of the first transistor SAT1. A second base contact of the third transistor SAT3 may be coupled with a second base contact of the fourth transistor SAT4 as well as with the second inner bit line BLc SA. In one embodiment, the second base contact of the third transistor SAT3 may be directly connected to the second inner bit line BLc SA. A gate contact of the third transistor SAT3 may be coupled with a gate contact of the fourth transistor as well as with a first further signal line ELt, as illustrated in FIG. 2.

Furthermore, the evaluation circuit SA may include the fourth transistor SAT4. The first base contact of the fourth transistor SAT4 may be coupled with the switch line pSET as well as with the first base contact of the second transistor SAT2. The second base contact of the fourth transistor SAT4 may be coupled with the second base contact of the third transistor SAT3 as well as with the second inner bit line BLc SA. In one embodiment, the second base contact of the fourth transistor SAT4 may be directly connected to the second inner bit line BLc SA. The gate contact of the fourth transistor SAT4 may be coupled with the gate contact of the third transistor SAT3 as well as with the first further signal line ELt, as illustrated in FIG. 2.

The first further signal line ELt may be coupled with the first outer bit line BLt. The second further signal line ELc may be coupled with the second outer bit line BLc.

When applying a low potential to the switch line nSET and a high potential to the switch line pSET, the evaluation circuit SA may cause an evaluation of the potentials applied to the first outer bit line BLt and to the second outer bit line BLc. In one embodiment, the first inner bit line BLt SA and the second inner bit line BLc SA may be charged to the potentials pSET and nSET according to the algebraic sign of the difference of potentials at the first outer bit line BLt and the second outer bit line BLc. For example, if the potential applied at the first outer bit line BLt is higher than the potential applied at the second outer bit line BLc, the first inner bit line BLt SA may be charged to the potential pSET and the second inner bit line BLc SA may be charged to the potential nSET. Conversely, if the potential applied to the first outer bit line BLt is lower than the potential applied at the second outer bit line BLc, the first inner bit line BLt SA may be charged to the potential nSET and the second inner bit line BLc SA may be charged to the potential pSET.

Figure 3:
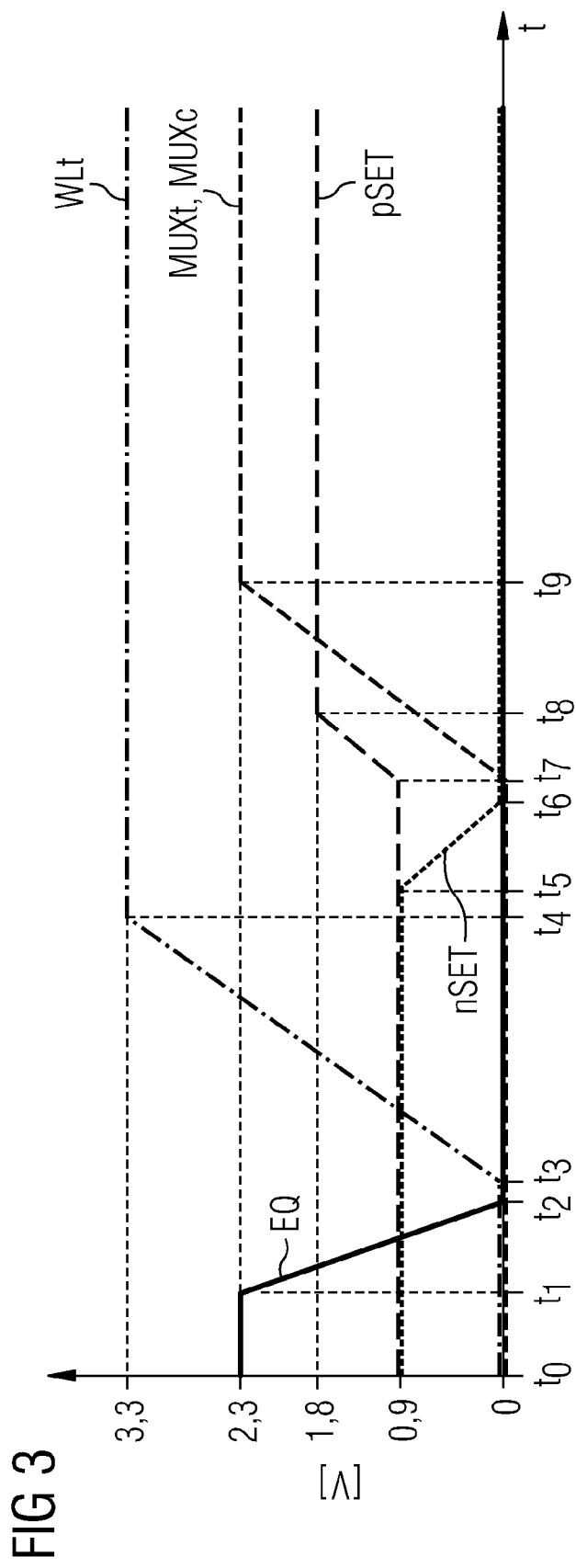
FIG. 3 schematically depicts exemplary timing of switching signals in an evaluation circuit, according to an embodiment of the invention.

FIG. 3 schematically shows the timing of the switching signals applied to the switch lines during an evaluation of potentials by the evaluation circuit SA, according to an embodiment of the invention. On the horizontal axis, the time t is plotted. The vertical axis shows the potentials applied at the various switch lines.

As illustrated in FIG. 3, at time t0, the switch line EQ has a high positive potential, such as, for example, 3.3 Volt in one embodiment, thus pre-charging the first inner bit line BLt SA and the second inner bit line BLc SA to the potential VBLEQ, e.g., in one embodiment to 0.9 Volt. In one embodiment, the first transistor switch MUXt and the second transistor switch MUXc may have already been opened before, thus connecting the first outer bit line BLt to the first inner bit line BLt SA and the second outer bit line BLc to the second inner bit line BLc SA. As a result, at time t0 the first outer bit line BLt and the second outer bit line BLc also have the potential VBLEQ. The switch lines nSET and pSET of the evaluation circuit SA may have a shared middle potential of e.g. 0.9 Volt so that the evaluation circuit SA does not amplify the potentials applied at the first outer bit line BLt and at the second outer bit line BLc.

The first word line WLt may be at a low potential of, for example, 0 Volt in one embodiment, thus disconnecting the first memory cell MCt from the first outer bit line BLt. The switch line of the first transistor switch MUXt may have a low potential, e.g. 0 Volt in one embodiment, thus decoupling the first outer bit line BLt from the first inner bit line BLt SA. The switch line of the second transistor switch MUXc may have a low potential, such as 0 Volt, thus decoupling the second outer bit line BLc from the second inner bit line BLc SA. This state is maintained until time t1. In the period between time t1 and time t2, the switch line EQ of the pre-charge unit PC may be reduced to a low potential, such as 0 Volt. Thus, the pre-charging of the bit lines may be brought to an end.

In the period between time t3 and time t4, the potential at the first word line WLt may be increased to a positive potential, e.g. 3.3 Volt in one embodiment. Thus, the storage capacitor 4 of the first memory cell MCt may be coupled with the first outer bit line BLt via the selection transistor 3 of the first memory cell MCt and in the period between time t4 and time t5, a charge ex-change may take place between the storage capacitor 4 of the first memory cell MCt and the first outer bit line BLt. Depending on the information stored in the first memory cell MCt, the first outer bit line BLt may be at a higher or lower potential at time t5 than the second outer bit line BLc.

In the period between time t5 and time t6, the potential applied at the switch line nSET of the evaluation circuit may be reduced to a low potential, such as 0 Volt in one embodiment. In the period between time t7 and time t8, the potential at the switch line pSET of the evaluation circuit SA may be increased to a high potential, such as 1.8 Volt in one embodiment. Thus, the evaluation of potential by the evaluation circuit SA may be started at time t8. The first inner bit line BLt SA and the second inner bit line BLc SA may be increased to the potentials of the switch lines nSET and pSET, or vice versa, depending on the algebraic sign of the potential difference on the first and second outer bit lines BLt, BLc. In one embodiment, if a higher potential is applied to the first outer bit line BLt than to the second outer bit line BLc, the first inner bit line BLt SA may be charged to the potential pSET and the second inner bit line BLc SA may be charged to the potential nSET. Conversely, if a lower potential is applied to the first outer bit line BLt than to the second outer bit line BLC, the first inner bit line BLt SA may be charged to the potential nSET and the second inner bit line BLc SA may be charged to the potential pSET.

In the same time period between time t7 and time t9, the potential at the gate contacts of the first and second transistor switch MUXt, MUXc may be raised to a high potential, e.g. 2.3 Volt in one embodiment. Thus, the first outer bit line BLt may be coupled to the first inner bit line BLt SA and the first outer bit line BLt may be charged to the amplified potential. Moreover, the second outer bit line BLc may thereby be coupled to the second inner bit line BLc SA and the second outer bit line BLc may be charged to the amplified potential.

Figure 4:
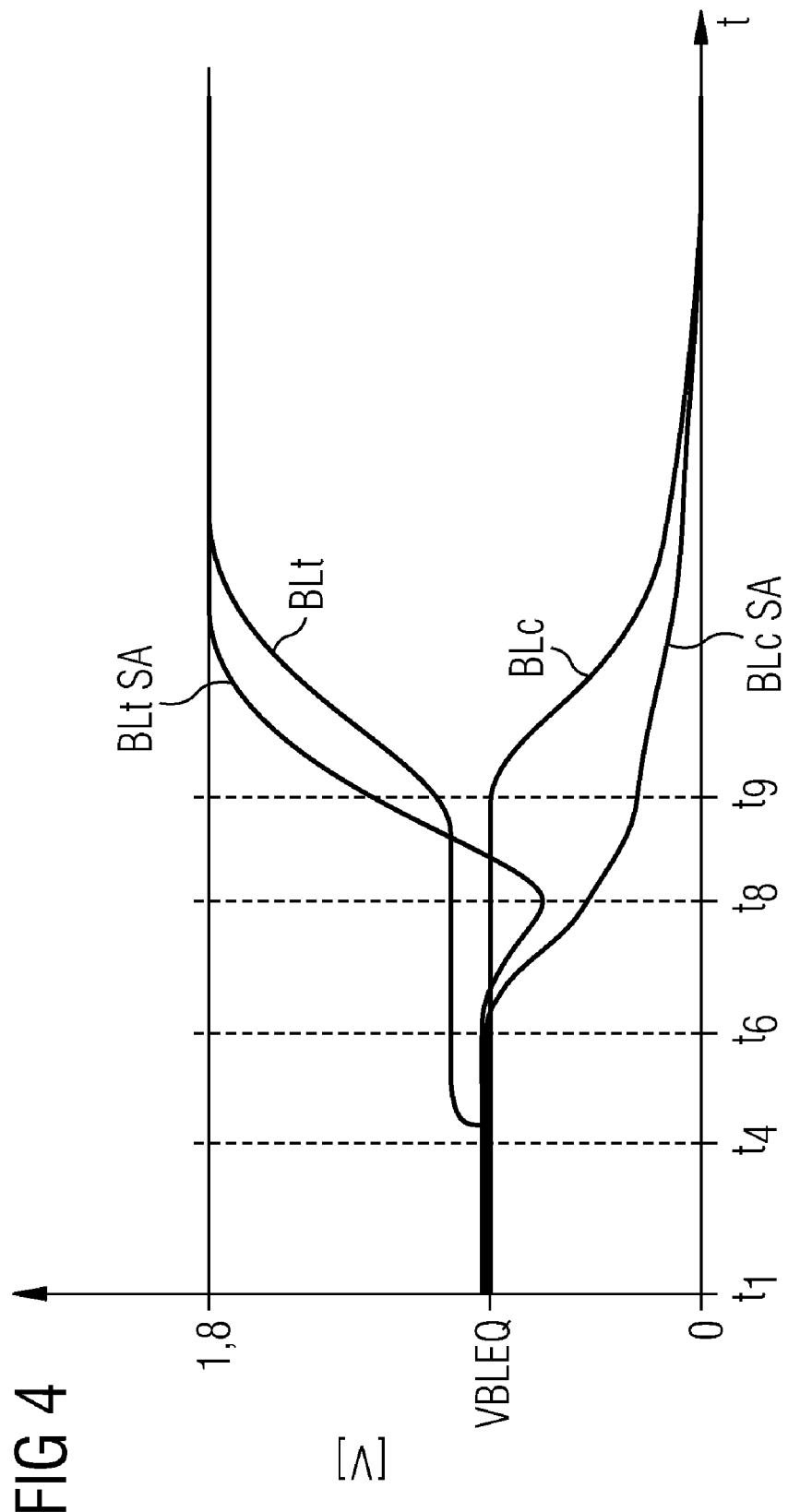
FIG. 4 schematically shows exemplary timing diagrams of the electric potentials of bit lines, reference lines and additional lines, according to an embodiment of the invention.

FIG. 4 schematically depicts a timing diagram of the potentials applied at the first and second outer and inner bit lines BLt, BLc, BLt SA and BLc SA during an evaluation carried out by an evaluation circuit SA, according to an embodiment of the invention. On the horizontal axis, the time t is plotted. The vertical axis shows the value of the potential applied to the respective bit line. The marked points of time t1, t4, t6, t8, t9 correspond to the accordingly designated points of time of FIG. 3.

At time t1, all bit lines may be pre-charged to the same potential VBLEQ, such as, for example, 0.9 Volt in one embodiment. At time t4, the potential at the first word line WLt may be increased and thereby, the selection transistor 3 of the first memory cell MCt may be opened, thus causing a charge equalization to take place between the storage capacitor 4 of the first memory cell MCt and the first outer bit line BLt. In the depicted example, the potential at the first outer bit line BLt thereby may slightly increase compared to the potential of the second outer bit line BLc.

At t6, the potential at the switch line nSET may be reduced to a low potential. This may start the evaluation of the potential difference at the first outer bit line BLt and the second outer bit line BLc by an evaluation circuit SA and a potential difference is established between the first inner bit line BLt SA and the second inner bit line BLc SA, the algebraic sign of which corresponds to the algebraic sign of the potential difference between the first outer bit line BLt and the second outer bit line BLc. In the depicted example, the potential on the second outer bit line BLc is lower than the potential on the first outer bit line BLt, which is why a lower potential is set at the second inner bit line BLc SA than at the first inner bit line BLt SA.

At time t8 a high potential, such as 1.8 Volt in one embodiment, and a low potential, such as 0 Volt in one embodiment, occur at the switch lines pSET and nSET of the evaluation circuit SA. The evaluation circuit SA may charge the first inner bit line BLt SA and the second inner bit line BLc SA according to the algebraic sign of the difference of potentials at the first outer bit line BLt and the second outer bit line BLc. In the depicted example, the potential at the first inner bit line BLt SA increases, while the potential at the second inner bit line BLc SA decreases.

As illustrated in FIG. 4, at time t9, a sufficiently large and stable potential difference has been established between the first inner bit line BLt SA and the second inner bit line BLc SA, so that the first and the second transistor switch MUXt, MUXc can be opened, thus also amplifying the potential difference between the first outer bit line BLt and the second outer bit line BLc. In the example, the potential at the first outer bit line BLt may be increased to, for example, 1.8 Volt in one embodiment, and the potential of the second outer bit line BLc may be reduced to a low potential, e.g. 0 Volt in one embodiment.

As illustrated in FIG. 4, at time t9, a sufficiently large and stable potential difference has been established between the first inner bit line BLt SA and the second inner bit line BLc SA and the transistors of the evaluation circuit SA are in a stable state with a predetermined charge current density. At this point in time, the first and the second transistor switch MUXt, MUXc can be opened, thus also amplifying the potential difference between the first outer bit line BLt and the second outer bit line BLc. After terminating the described evaluation procedure by means of the evaluation circuit SA, the first outer bit line BLt may be at a high potential, such as 1.8 Volt in one embodiment, depending on the data stored in the first memory cell MCt prior to evaluation, or at ground potential. The data signal amplified in this manner may now be further utilized.

While the foregoing is directed to embodiments of the invention, other and further embodiments of this invention may be devised without departing from the basic scope of the invention, the scope of the present invention being determined by the claims that follow.

What is claimed is:

1. A memory device, comprising:
a memory cell; and
an evaluation circuit coupled with:
    a reference line having a first part coupled via a first switch to a remaining part of the reference line; and
    the memory cell via a bit line having a first part coupled via a second switch with a remaining part of the bit line, the remaining part of the bit line being connected with the memory cell;
wherein the evaluation circuit is:
    configured to amplify a difference between electric potentials on the bit line and the reference line,
    directly connected to: (i) the first part of the bit line, (ii) the remaining part of the bit line, (iii) the first part of the reference line, and (iv) the remaining part of the reference line,
    a sense amplifier or a read amplifier configured to amplify a potential difference between bit line and the reference line by amplifying their respective electric potentials to two pre-determined potential values in multiple steps, comprising:
        a first step in which the first part of the bit line and the remaining part of the bit line are not connected via the second switch and the first part of the reference line and the remaining part of the reference line are not connected via the first switch, wherein the difference of the potentials of the first part of the bit line and the first part of the reference line are amplified depending on the different potentials on the remaining part of the bit line and the remaining part of the reference line,
        a second step in which the first part of the bit line is connected via the second switch with the remaining part of the bit line and the first part of the reference line is connected to the reference line via the first switch, wherein the potential difference of the bit line and the reference bit line is further amplified.

2. The memory device of claim 1, wherein the reference line is the bit line of another memory cell.

3. The memory device of claim 1, wherein the memory cell is a dynamic random access memory.

4. The memory device of claim 1, wherein the evaluation circuit includes a first transistor, a first base contact of the first transistor coupled with a switch line and with a first base contact of a third transistor, a second base contact of the first transistor coupled with a second base contact of a second transistor and with a first inner bit line, a gate contact of the first transistor coupled with a gate contact of the second transistor and with a second further signal line, a first base contact of the second transistor coupled with the switch line and with a first base contact of a fourth transistor, the second base contact of the second transistor coupled with the first inner bit line, a gate contact of the second transistor and with the second further signal line, the first base contact of the third transistor coupled with the switch line, a second base contact of the third transistor coupled with a second base contact of the fourth transistor and with the second inner bit line, a gate contact of the third transistor coupled with a gate contact of the fourth transistor and with a first further signal line, the first base contact of the fourth transistor coupled with the switch line and with the first base contact of the second transistor, the second base contact of the fourth transistor coupled with the second base contact of the third transistor and with the second inner bit line, the gate contact of the fourth transistor coupled with the gate contact of the third transistor and with the first further signal line, the first further signal line coupled with the first outer bit line, the second further signal line is coupled with the second outer bit line;

wherein:
the first inner bit line is the first part of the bit line,
the first outer bit line is the remaining part of the bit line,
the second inner bit line is the first part of the reference line,
the second outer bit line is the remaining part of the reference line.

5. A method for reading out data, comprising:
providing a memory device comprising:
a memory cell;
an evaluation circuit;
a bit line having a first part coupled via a switch to a remaining part of the bit line, wherein the first part of the bit line is connected with the evaluation circuit and the remaining part of the bit line is connected with the memory cell and with the evaluation circuit;
a reference line having a first part coupled via a switch to a remaining part of the reference line, wherein the first part of the reference line and the remaining part of the reference line are connected with the evaluation circuit;
amplifying, by the evaluation circuit, a difference between electric potentials on the first part of the bit line and the first part of the reference line depending on the difference of electric potentials on the remaining part of the bit line and the remaining part of the reference line, wherein the first part of the bit line is disconnected from the remaining part of the bit line and the first part of the reference line is disconnected from the remaining part of the reference line;
after a predetermined period of time, coupling the first part of the bit line to the remaining part of the bit line and the first part of the reference line to the remaining part of the reference line; and
amplifying further, by the evaluation circuit, a difference between electric potentials on the first part of the bit line and the remaining part of the bit line and the first part of the reference line and the remaining part of the reference line.

6. The method of claim 5, wherein the first part of the bit line is coupled to the remaining part of the bit line and the first part of the reference line is coupled to the remaining part of the reference line after transistors of the evaluation circuit are in a stable state with a predetermined charge current density.

7. The method of claim 5, wherein the evaluation circuit is activated while a transistor switch between the first part of the bit line and the bit line is closed, and the transistor switch between the first part of the bit line and the bit line is opened after the evaluation circuit is activated.

8. An integrated circuit, comprising a memory device, the memory device comprising:
a memory cell; and
an evaluation circuit coupled with:
a reference line having a first part coupled via a first switch to a remaining part of the reference line; and
the memory cell via a bit line having a first part coupled via a second switch with a remaining part of the bit line, the remaining part of the bit line being connected with the memory cell;
wherein the evaluation circuit is:
configured to amplify a difference between electric potentials on the bit line and the reference line,
directly connected to: (i) the first part of the bit line, (ii) the remaining part of the bit line, (iii) the first part of the reference line, and (iv) the remaining part of the reference line,
a sense amplifier or a read amplifier configured to amplify a potential difference between bit line and the reference line by amplifying their respective electric potentials to two pre-determined potential values in multiple steps, comprising:
a first step in which the first part of the bit line and the remaining part of the bit line are not connected via the second switch and the first part of the reference line and the remaining part of the reference line are not connected via the first switch, wherein the difference of the potentials of the first part of the bit line and the first part of the reference line are amplified depending on the different potentials on the remaining part of the bit line and the remaining part of the reference line, and
a second step in which the first part of the bit line is connected via the second switch with the remaining part of the bit line and the first part of the reference line is connected to the remaining part of the reference line via the first switch, wherein the potential difference of the bit line and the reference bit line is further amplified.

* * * * *